(12) United States Patent
Draaijer et al.

(10) Patent No.: US 7,148,950 B2
(45) Date of Patent: Dec. 12, 2006

(54) LITHOGRAPHIC APPARATUS AND DEVICE MANUFACTURING METHOD

(75) Inventors: Evert Hendrik Jan Draaijer, Eindhoven (NL); Martinus Agnes Willem Cuijpers, Veldhoven (NL); Menno Fien, Goirle (NL); Marcus Joseph Elisabeth Godfried Breukers, Eindhoven (NL); Martijn Houkes, Sittard (NL); Edwin Teunis Van Donkelaar, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 121 days.

(21) Appl. No.: 10/880,605

(22) Filed: Jul. 1, 2004

(65) Prior Publication Data

US 2005/0012912 A1 Jan. 20, 2005

(30) Foreign Application Priority Data

Jul. 1, 2003 (EP) .................................. 03077048

(51) Int. Cl.
*G03B 27/42* (2006.01)

(52) U.S. Cl. ........................... 355/53; 355/72; 356/400
(58) Field of Classification Search ...................... None
See application file for complete search history.

(56) References Cited

U.S. PATENT DOCUMENTS

| 5,229,872 A | 7/1993 | Mumola |
| 5,296,891 A | 3/1994 | Vogt et al. ..................... 355/53 |
| 5,511,930 A * | 4/1996 | Sato et al. ................... 356/498 |
| 5,523,193 A | 6/1996 | Nelson |
| 5,969,441 A | 10/1999 | Loopstra et al. .............. 310/12 |
| 6,046,792 A | 4/2000 | Van Der Werf et al. ...... 355/53 |

FOREIGN PATENT DOCUMENTS

| EP | 0 557 100 | 8/1993 |
| EP | 1 186 959 | 3/2002 |
| WO | WO 98/33096 | 7/1998 |
| WO | WO 98/38597 | 9/1998 |
| WO | WO 98/40791 | 9/1998 |

* cited by examiner

*Primary Examiner*—D. Rutledge
(74) *Attorney, Agent, or Firm*—Pillsbury Winthrop Shaw Pittman LLP

(57) ABSTRACT

A lithographic apparatus that includes an exposure system and a measurement system, is presented. The exposure system projects a patterned beam onto a target portion of a first substrate, while the measurement system projects a measurement beam on a target portion of a second substrate. Movement of a movable part of the apparatus generates a disturbance in a position of another movable part of the apparatus, e.g. due to displacement of air. This error can be compensated by calculating a compensation signal which is a function of states of one or both of the movable parts.

11 Claims, 4 Drawing Sheets

LITHOGRAPHIC APPARATUS AND DEVICE MANUFACTURING METHOD

BACKGROUND OF THE INVENTION

1. Priority Information

This application claims priority from European Patent Application No. 03077048.1, filed Jul. 1, 2003, herein incorporated by reference in its entirety.

2. Field of the Invention

The present invention relates to a lithographic apparatus and associated exposure and measurement systems.

3. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to a device that can be used to impart an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

- a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table/holder/holder, which ensures that the mask can be held at a desired position in the incoming radiation beam, and that it can be moved relative to the beam if so desired;
- a programmable mirror array: one example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and
- a programmable LCD array: an example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table/holder/holder; however, the general principles discussed in such instances should be seen in the broader context of the patterning device as set forth here above.

In general, a single wafer will contain a whole network of adjacent target portions that are successively irradiated via the projection system, one at a time. In current apparatus, employing patterning by a mask on a mask table/holder/holder, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table/holder/holder parallel or anti-parallel to this direction. Since, in general, the projection system will have a magnification factor M (generally <1), the speed V at which the substrate table/holder/holder is scanned will be a factor M times that at which the mask table/holder/holder is scanned. More information with regard to lithographic devices as here described can be gleaned, for example, from U.S. Pat. No. 6,046,792, incorporated herein by reference.

In a manufacturing process using a lithographic apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate table/holder/holders (and/or two or more mask table/holders). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

SUMMARY OF THE INVENTION

A problem associated with the lithographic apparatuses and associated device manufacturing methods, as mentioned above, is that a movement of a movable part of the measurement system may influence a position of the movable part of the exposure system and vice versa. Because the resolution of the desired pattern is high and, consequently, accuracy requirements of the lithographic apparatus are stringent, a small disturbance might lead to a deterioration of the accuracy of the lithographic apparatus and/or to a deterioration in the production yield of the apparatus.

The principles of the present invention, as embodied and broadly described herein, provide an improvement in the accuracy of the lithographic apparatus and associated device manufacturing methods. In one embodiment, the lithographic apparatus, comprises an exposure system that comprises a radiation system configured to condition a beam of radiation; a support structure configured to support a patterning device that imparts a desired pattern to the beam of radiation; a substrate holder configured to hold a first substrate; and a projection system that projects the patterned beam onto a target portion of the first substrate, the projection system comprising a projection control mechanism that is configured to control the projection onto the target position of the first substrate; and a first control mechanism configured to move a movable part of the exposure system such that the patterned beam is movable relative to the first substrate.

The lithographic apparatus also comprises a measurement system that comprises an optical measurement device that projects a measurement beam to measure a surface property of a target portion of a second substrate; a second substrate holder configured to hold the second substrate; and a second control mechanism configured to move a movable part of the measurement system such that the measurement beam is movable relative to the second substrate.

The lithographic apparatus further comprises a correction determination mechanism configured to generate a correction signal that at least partly corrects an error of a position of the exposure system movable part or the measurement system movable part in which the error is respectively caused by a movement of the measurement system movable part or exposure system movable part; and a feeding mechanism configured to supply the correction signal into the first or second control mechanisms for at least partly correcting the position of the exposure system or the measurement system.

The present invention exploits the realization that an error in the position of one of the movable parts is due to a movement of the other one of the movable parts due to a displacement of air caused by the movement of the other one of the movable parts. According to the invention, the error which results from the displacement of air is corrected, or at least partly corrected, by determining a correction signal and feeding the correction signal into the control mechanisms which control the position of the one, i.e. the disturbed of the movable parts.

The first and second control mechanisms can comprise dedicated hardware, such as an analogue electronic control system, however it is also possible that one or both of the control mechanisms are programmed in software which is executed by a processing means, such as a microprocessor dedicated for this function, or by processing means of the apparatus which also performs one or more other functions in the apparatus.

The movable part of the exposure system can for example be the projection system or part thereof, the substrate table/holder for holding the first substrate, or any other suitable part, such that the patterned beam projected on a portion of the first substrate moves to another portion of the first substrate, when moving the movable part. Similarly, the movable part in the measurement system can comprise the second substrate table/holder or (a part of) the optical measurement device, or any other element, such that the target portion of the second substrate onto which the measurement beam is projected, displaces with respect to the substrate, when moving the movable part.

The optical measurement device advantageously serves to measure a surface property (such as a flatness) of the second substrate, to which end a measurement beam is projected in operation on a target portion of the second substrate.

It is possible that a correction signal is determined for at least partly correcting the position of the movable part of the exposure system, the error by a movement of the movable part of the optical measurement system, however it is also possible that an error in the position of the movable part of the measurement system is corrected or at least partly corrected, by means of the correction signal, the error by a movement of the movable part of the exposure system. Of course, it is also possible that both corrections are applied simultaneously, consecutively, or in an alternating manner.

It will be understood that the movable part of the exposure system and/or the measurement system can comprise a respective single movable part, however it is possible that one or both of the movable parts each comprises two or more movable subparts each moving in a same or a different (such as an opposite) direction.

Also, it will be understood that the error could not only be caused by a displacement of air or other atmosphere or gas in which the apparatus is operating, but instead or in addition due to any other cause of transfer of the disturbance, such as by mechanical vibrations, etc.

The feeding mechanism can e.g. comprise a signal to force converter for converting the correction signal into a correction force, however the feeding mechanism can also comprise any other suitable means, such as an analogue or digital addition, subtraction etc. for combining the correction signal with any other suitable signal in the apparatus.

Advantageously, the correction determination mechanism are adapted for determining the correction signal from states (such as mechanical states, positions, movements etc., or any combination thereof) of one or both of the movable parts.

Advantageously, the correction determination mechanism are adapted for calculating the correction signal from information, preferably an acceleration, of the movable part of the other one of the exposure system and the measurement system, and a distance between the movable parts of the measurement system and the movable part of the exposure system. The inventor has devised that the influence on the movable part of the one of the measurement system and the exposure system caused by a movement of the movable part of other one of the measurement system and the exposure system decreases when the distance between these parts increases, and that the disturbance, and thus the error is related to the acceleration of the movable parts. With this advantageous embodiment a good estimate of the disturbance, and thus a suitable value of the correction signal can be determined.

Advantageously, the information comprises the acceleration, the acceleration being provided by an acceleration detector comprised in the first or second control mechanisms (comprised in the other one of the exposure system and the measurement system) and wherein the distance which is calculated from the respective positions of the movable parts of the exposure system and the measurement system, the respective positions being provided by respective position detectors comprised in the exposure system and the measurement system. Thus, little or no additional hardware in the apparatus is required as acceleration information and position information from detectors already present in the system can be applied for calculating the correction signal.

Advantageously, an x axis and a y axis being defined in a plane in which the movable parts of the exposure system and the measurement system are movable, the correction determination mechanism being adapted for determining an x-correction signal for correcting an error in the position of the movable part of the one of the exposure system and the measurement system along the x-axis from an x-axis component of the information and for determining an y-correction signal for correcting an error in the position of the movable part of the one of the exposure system and the measurement system along the y-axis from an y-axis component of the information. A movement of the other one of the movable parts in a certain direction will result in an error caused by displacement of air in the same direction, which can thus be corrected.

Advantageously, the control mechanisms are adapted for calculating the correction signal making use of the formula $$F_{x,y} = \frac{C * Acc_{x,y}}{D_{xy}^2}$$

wherein $F_{x,y}$ is the correction signal in x and y direction respectively, C is a constant, $Acc_{x,y}$ is the acceleration in x and y direction respectively, and $D_{xy}$ is the distance between the movable parts of the exposure system and the measurement system. The constant C can be identical for the correction in the x direction and the y direction, however it is also possible that different values for the constant C are applied.

Advantageously, the correction determination mechanism being adapted for determining an x to y-correction signal for correcting an error in the position of the movable part of the one of the exposure system and the measurement system along the x-axis from an y-axis component of the information and for determining an y to x-correction signal for correcting an error in the position of the movable part of the one of the exposure system and the measurement system along the y-axis from an x-axis component of the information. In this manner, a more accurate correction can be achieved, and as a movement of one of the movable parts in the x or y direction will also result in a correction of the other one of the movable parts in the other (thus the y or x) direction.

Advantageously, the control mechanisms are adapted for calculating the x to y- or y to x-correction signal making use of the formula $$F_{x\ to\ y, y\ to\ x} = \frac{C * D_x * Acc_{x,y}}{D_y^2}$$

wherein $F_{x\ to\ y,\ y\ to\ x}$ is the x to y and the y to x correction signal respectively, C is a constant, $Acc_{x,y}$ is the acceleration in x and y direction respectively, $D_x$ is the distance between the movable parts of the exposure system and the measurement system in x direction, and $D_y$ is the distance between the movable parts of the exposure system and the measurement system in y direction. Also in this situation, the constant C can have different values for the x to y and the y to x correction, however can have also have identical values for these two corrections, and the value of the constant C can be identical of different to the value(s) of the constant C for calculating the $F_{x,y}$ correction signal.

The apparatus can comprise a delay for delaying the or each correction signal, such that delays due to digital processing applied in the control mechanisms can be taken into account.

Advantageously, the feeding mechanism are adapted for adding the or each correction signal to a control signal, such as a force signal, at an output of a regulator in a closed loop feedback control loop. As the output of the control is connected to a control input of a positioning device for displacing the movable part, the correction signal is added at a place in the control loop the most similar to the place where the disturbance too is acting, thus resulting in a good compensation of the error.

In another embodiment, a device manufacturing method is presented. The device manufacturing method, comprises providing a first substrate that is at least partially covered by a layer of radiation-sensitive material; conditioning a beam of radiation; configuring the conditioned beam of radiation with a desired pattern in its cross-section; projecting the patterned beam of radiation onto a target portion of the first substrate; moving the patterned beam relative to the first substrate; providing a second substrate; projecting a measurement beam onto a target portion of the second substrate to measure a surface property; moving the measurement beam relative to the second substrate; determining a correction signal for at least partly correcting an error of a position of the patterned beam or the measurement beam relative to the respective first substrate or second substrate, wherein the error is caused by a movement of a device that moves the other of the patterned beam or the measurement beam relative to the other one of the first substrate or second substrate; and correcting the position of the patterned beam or the measurement beam relative to the respective first or second substrate based on the correction signal.

It will be clear to the skilled person that advantageous embodiments as described above with reference to the apparatus according to the invention, can also be applied to the method according to the invention.

The compensation according to the invention can not only be applied for compensating an error due to a movement of a movable part of the other one of the measurement system and the exposure system, but can be applied for compensating a disturbance caused by any other movable part of the apparatus.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
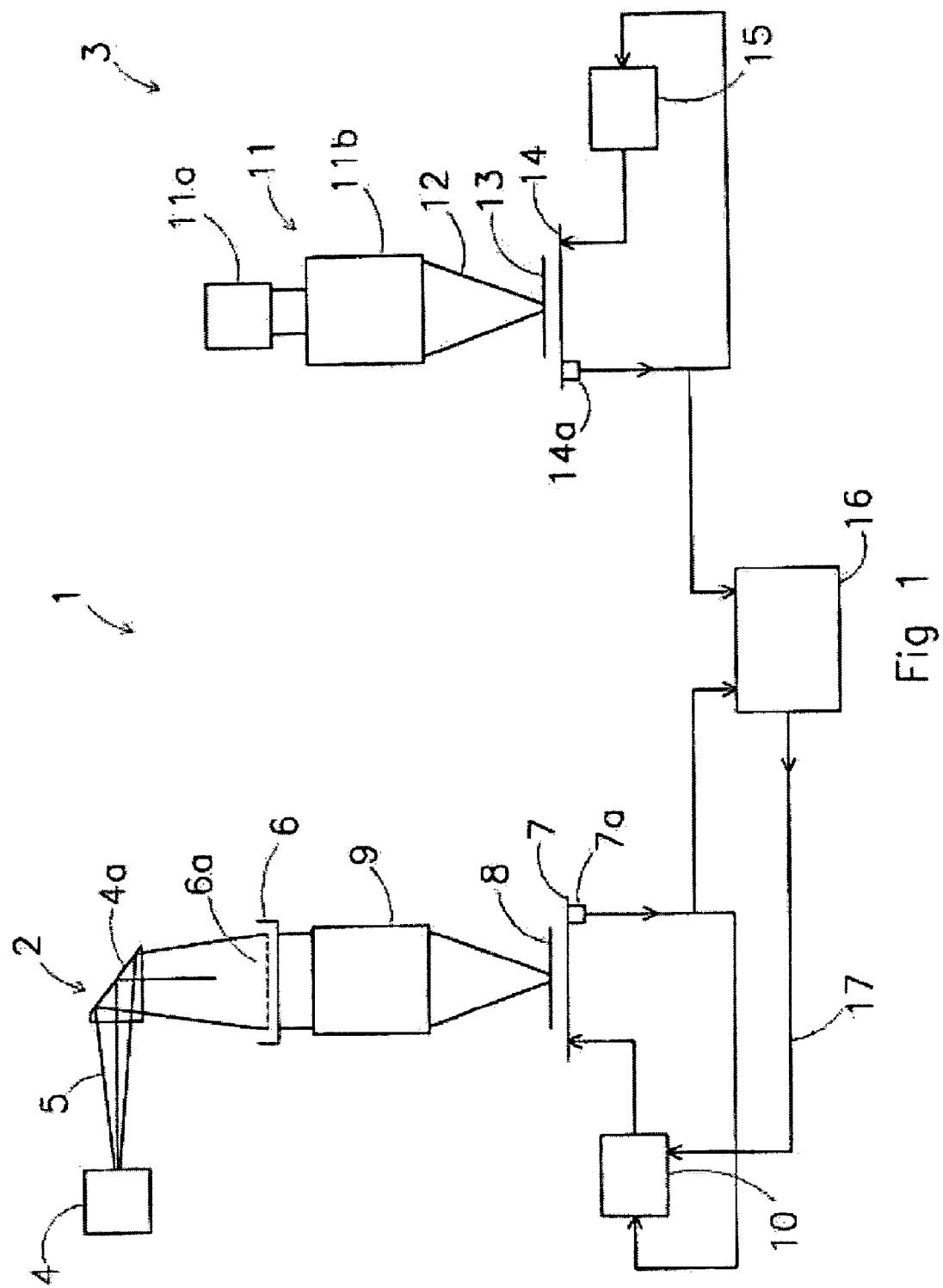
FIG. 1 schematically depicts a lithographic projection apparatus according to an embodiment of the invention.

FIG. 1 schematically depicts a lithographic apparatus 1 according to an embodiment of the invention. The apparatus 1 comprises an exposure system 2 and a measurement system 3. The exposure system 2 comprises a radiation system 4, such as a light source for generating a projection beam of radion 5 and a prism (or other deflection means) 4a, a support structure for the patterning device 6a, such as a reticle, a substrate table/holder 7 for holding a first substrate 8, and a projection system 9 for projecting the patterned beam onto a target portion of the second substrate 13.

The measurement system 3, such as an optical measurement device, may comprise a radiation system 11a, a projection system 11b and further elements (not shown) for measuring a surface property of the target portion of the second substrate 13 by means of reflection, a geometric change, absorption, diffraction or any other physical phenomena due to the projection of the measurement beam 12 on the target portion of the second substrate 13. The measurement system 3 further comprises a second substrate table/holder 14 for holding the second substrate 13 and second control mechanisms 15 for moving at least a part of the measurement system 3, such that the measurement beam is movable over the substrate 13.

The exposure system 2 exposes target portions of the first substrate and thus projects the pattern provided by the patterning device 6c onto the first substrate 8. In this embodiment, the substrate table/holder 7 is moved under control of the first control mechanisms 10, such that the patterned beam moves with respect to the first substrate 8, thus providing the possibility for scanning the first substrate and exposing each desired part of the first substrate.

Concurrent with the movement of the movable part of the exposure system 2 (the movable part in this example being the substrate 8) the measurement system 3 measures a surface property, such as a flatness of a second substrate 13. As the surface property of a relevant part of the second substrate is to be measured, a scanning movement of the measurement beam 12 with respect to the second substrate 13 is accomplished, as explained above by moving the second substrate 13 and the correction beam 12 with respect to each other.

With the lithographic apparatus 1, exposing a first substrate 8 and measuring a second substrate 13 (the substrates for example being semiconductor wafers), can be performed simultaneously. Each of the movable parts, in this example the substrate table/holder 7 and the substrate table/holder 14, is controlled by respective control mechanisms 10, 15 controlling a position of the respective substrate table/holder 7, 14. The control mechanisms 10, 15 each form a close loop control circuit with respective position detection mechanisms 7a, 14a, such as position sensors, acceleration sensors, etc. The structure of the first and second control mechanisms will be explained in more detail below.

The apparatus 1 further comprises correction determination mechanism 16 for determining a correction signal. The correction signal is fed via feeding mechanism 17 into the first control mechanism 10. The correction determination mechanism 16 is supplied with position information regarding a position of the first and second substrate table/holder, the position information being supplied by the respective position sensors 7a and 14a of the first and second substrate table/holders 7 and 14.

The determination mechanism 16 calculates a correction signal from the information provided by the sensors 7a and 14a. The correction signal provides a correction for a disturbance and consequently a position error in the exposure system, which is caused by a movement of the movable part (in this example the movable substrate table/holder 14) of the measurement system 3. Due to the movement of the movable parts, pressure waves in air surrounding the respective movable parts are generated, which pressure waves tend to cause disturbances in the other system (in this example the exposure system 2). Although the error caused by such air displacement might at first sight be small in absolute terms, and be in an order of magnitude of nanometers or micrometers, it might lead to a significant error in the system which is influenced, as accuracy requirements of the projection apparatus 1 are in general high.

The correction determination mechanism 16 in this embodiment calculates the correction signal from an acceleration of the movable part of the measurement system (i.e. the second table 14) and a distance between the respective movable parts, i.e. in this example the first and second substrate table/holders 7 and 14. Thus, in this example, the sensor 14a comprises an acceleration sensor for measuring an acceleration of the substrate table/holder 14 as well as position sensors for detecting a position of the second substrate table/holder 14. The sensor 7a, in this example, comprises at least a position sensor for detecting the position of the first substrate table/holder 7. Consequently, the position of both substrate table/holders 7 and 14 as well as the acceleration of the second substrate table/holder 14 is provided to the correction determination mechanism. From the positions of the first and second substrate table/holders 7 and 14 a distance between these substrate table/holders is calculated by the correction determination mechanism 16, the distance being applied for calculating the correction signal. In this example, the correction signal is calculated by incorporating the following formula:

$$F = \frac{C * Acc}{D^2}$$

wherein F is the correction signal, C is constant, Acc is the acceleration and D is the distance between the movable parts of the exposure system and de measurement system. In this example, a position of a movable part of the exposure system is corrected, thus Acc being the acceleration of the other movable part, thus the movable part of the measurement system.

Figure 2B:
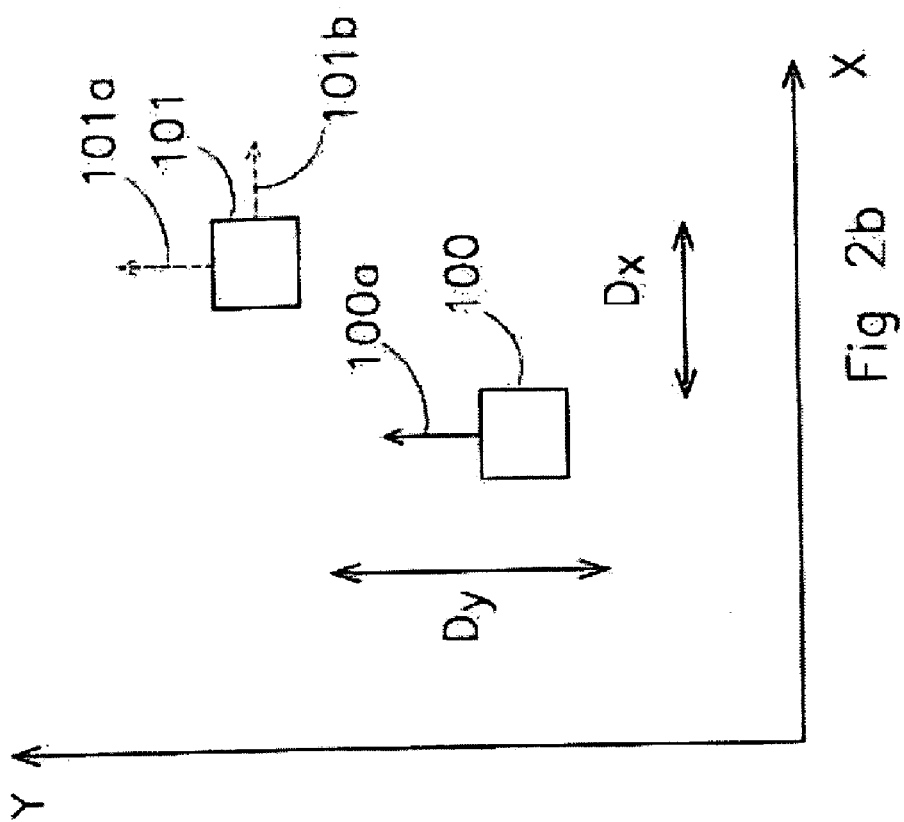
FIG. 2 schematically depicts a top view of movable parts of the exposure system and the measurement system.
Figure 2A:
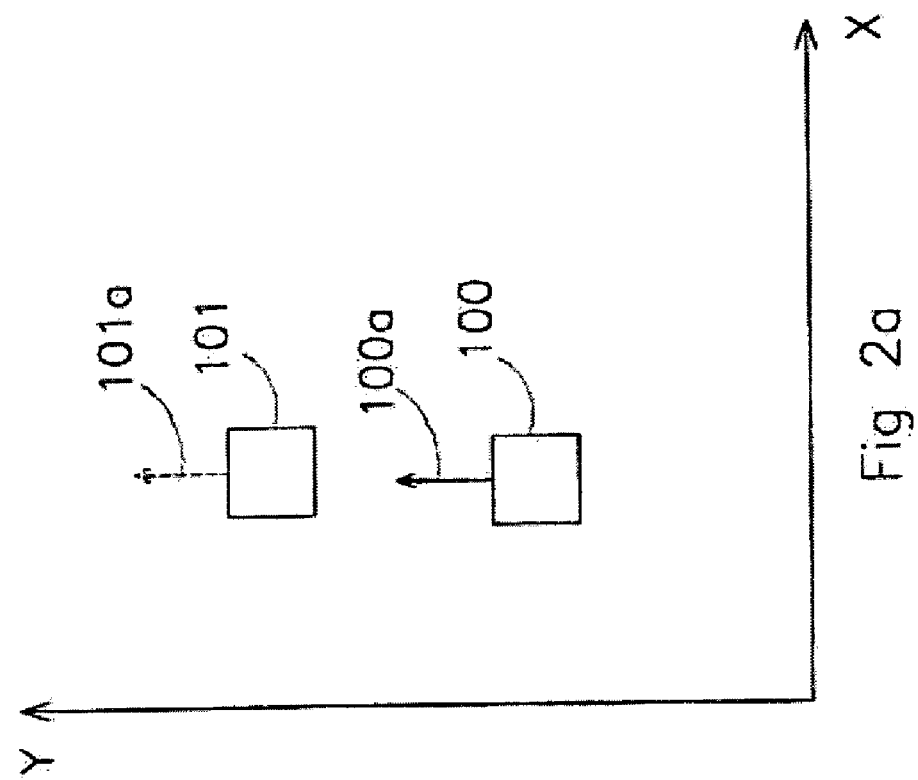

FIGS. 2a and 2b schematically depict a top view of a movable part 100 of the measurement system 3 and a movable part 101 of the exposure system 2. FIGS. 2a and 2b also show a coordinate system comprising an x axis and an y axis. The x axis and y axis are defined in a plane in which the movable parts 100 and 101 are movable. When the movable part 100 makes a movement indicated with the arrow 100a, displacement of air will cause a disturbance on the second movable part 101 acting in a direction indicated by the dotted arrow 101a. According to the present invention, a correction signal is calculated by the correction determination mechanism which at least partly counteract an influence of the disturbance 101a. For this calculation, consistent with the embodiment described, the following formula is used:

$$F_{x,y} = \frac{C * Acc_{x,y}}{D_{xy}^2}$$

wherein $F_{x,y}$ is the correction signal in x and y direction respectively, C is a constant, $Acc_{x,y}$ is the acceleration in x and y direction respectively, and $D_{xy}$ is the distance between the movable parts of the exposure system and the measurement system.

In FIG. 2b, the displacement of the movable part 100, which is schematically indicated by the 100a causes a pressure wave in the surrounding air which influences the movable part 101 and causes a disturbance indicated by the arrows 101a and 101b. The disturbance indicated by the arrow 111a is in the direction of the y axis, while the disturbance indicated by the arrow 101b is in the direction of the x axis. Thus, the displacement 100a which is in the direction of the y axis causes a disturbance of the movable part 101 in the direction of the x axis as well as the direction of the y axis.

In this example, this is due to the offset in the direction in the x axis between the movable parts 100 and 101, however might be due to any other cause, such as geometry of the surrounding, etc. The correction determination mechanism is adapted to calculate the correction signal comprising a component that at least partly compensates the disturbance 101a in the y direction and a component for at least partly compensating the disturbance 101b in the x direction. In this embodiment, the respective components of the correction signal are calculated making use of the formula:

$$F_{x \, to \, y, y \, to \, x} = \frac{C * D_x * Acc_{x,y}}{D_y^2}$$

wherein $F_{x \, to \, y, \, y \, to \, x}$ is the x to y and the y to x correction signal respectively, C is a constant, $Acc_{x,y}$ is the acceleration in x and y direction respectively, $D_x$ is the distance between the movable parts of the exposure system and the measurement system in x direction, and $D_y$ is the distance between the movable parts of the exposure system and the measurement system in y direction. Thus, $F_{x \, to \, y}$ represents a correction in the y direction due to a movement of the other movable part in the x direction and vice versa. The distances $D_x$ and $D_y$ are indicated in FIG. 2b.

As such, when the distance $D_x$ in x direction is zero, as depicted in FIG. 2a, a calculation of the x to y and y to x compensation will result in a correction having a value zero, while the larger the distance $D_x$ (FIG. 2b as compared to FIG. 2a), the larger the x to y- and/or y to x-compensation signal will be.

Figure 3:
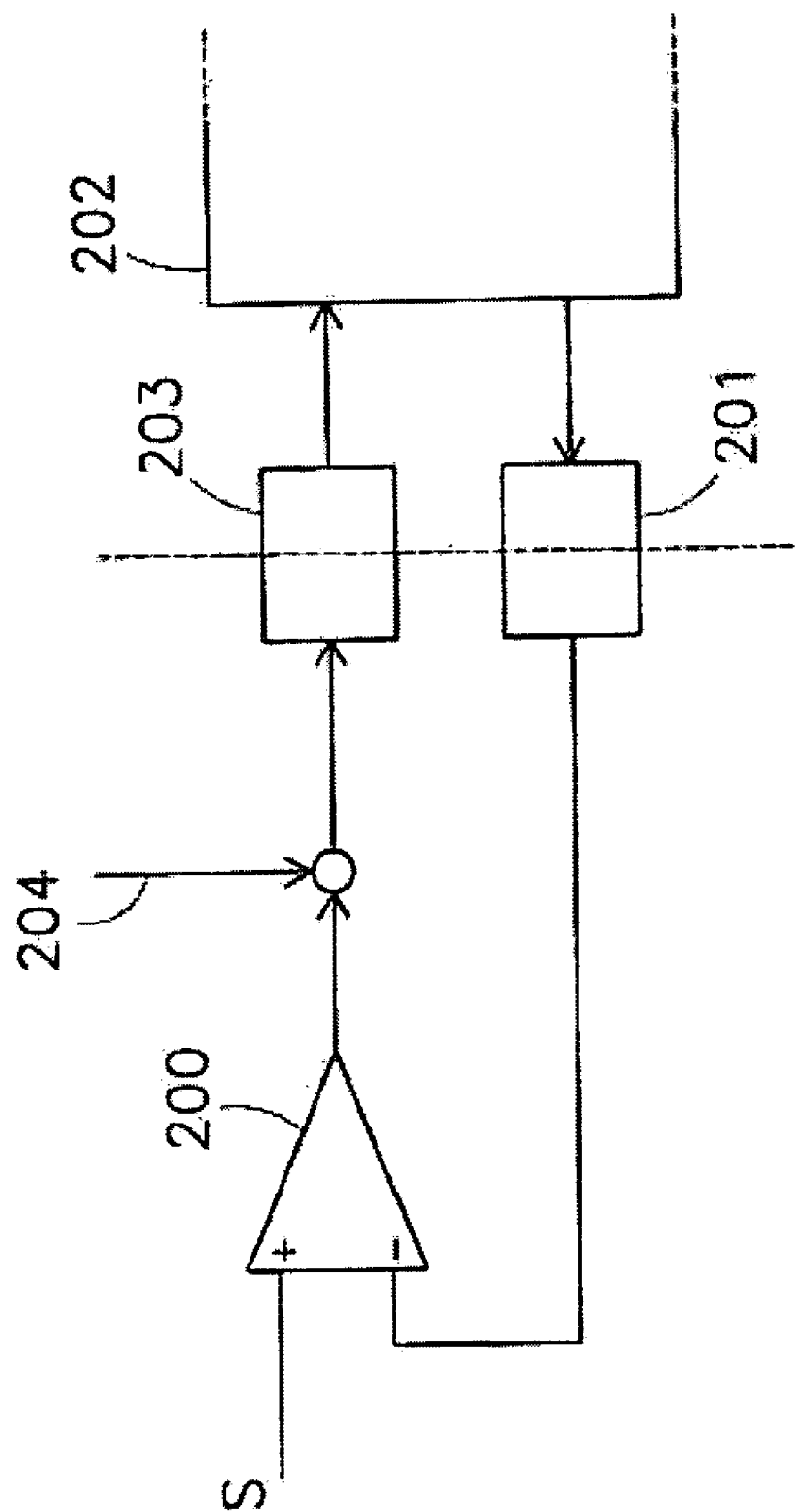
FIG. 3 schematically depicts a close loop control loop for controlling a position of one of the movable parts of the apparatus according to the invention.

FIG. 3 shows a more detailed schematic representation of a closed loop control loop comprising the first control mechanism 10, as depicted in FIG. 1. The first control mechanism comprises a regulator 200 having two inputs. The first input of the regulator 200 is connected to a set point signal S which provides a set point, i.e. a signal representing a desired position of the movable part. The other input of the regulator 200 is connected to a sensor, 201, such as a position sensor or an acceleration sensor which detects a position or acceleration of the movable part 202.

The movable part, of which only a highly schematically depicted part is shown, is positioned by positioning mechanism 203. Positioning mechanism 203 may take the form of, for example, an actuator. The positioning mechanism 203 is driven by an output signal of the regulator 200. The regulator 200 can, for example, be an analogue electronic regulator, however it is also possible that the regulator 200 is implemented by means of suitable software instructions running on a microprocessor or a microcomputer. The regulator 200 can comprise integration, proportional regulation, differentiation or any suitable operations.

The dashed line of FIG. 3, which crosses the positioning mechanism 203 and the sensor 201, represents a separation between an "electronic" or "control" part and a "physical" part. The increase of a disturbance due to displacement of another movable part of the apparatus, air pressure fluctuations, or pressure waves caused by this displacement will result in a disturbance of the movable part 202. To (at least partly) compensate for the disturbance of the movable part 202, a compensation signal 204 is added to the output signal of the regulator 200, thus feeding the correction signal into the control loop. If the control mechanisms comprise a digital regulator, comprising dedicated hardware or programmed in software, than the feeding mechanism for feeding the correction signal into the control mechanisms for example comprise a digital addition of subtraction implemented in either hardware or software, however it is also possible that the feeding mechanism comprise any other suitable means for feeding the correction signal into the respective control mechanisms, such as an analogue addition adding a voltage or a current, any suitable means, or any other way of feeding the correction signal into the control mechanisms.

In case that the first and/or second control mechanisms comprise digital control mechanisms, the feeding mechanism according to this embodiment comprise a delay for delaying the correction signal. The delay in this example matches a delay of the digital control mechanisms, such that adverse effects due to for example a to early compensation by the correction signal are largely eliminated; thus the feeding mechanism add the correction signal to a control signal at the output of the regulator in the closed loop control.

Figure 4:
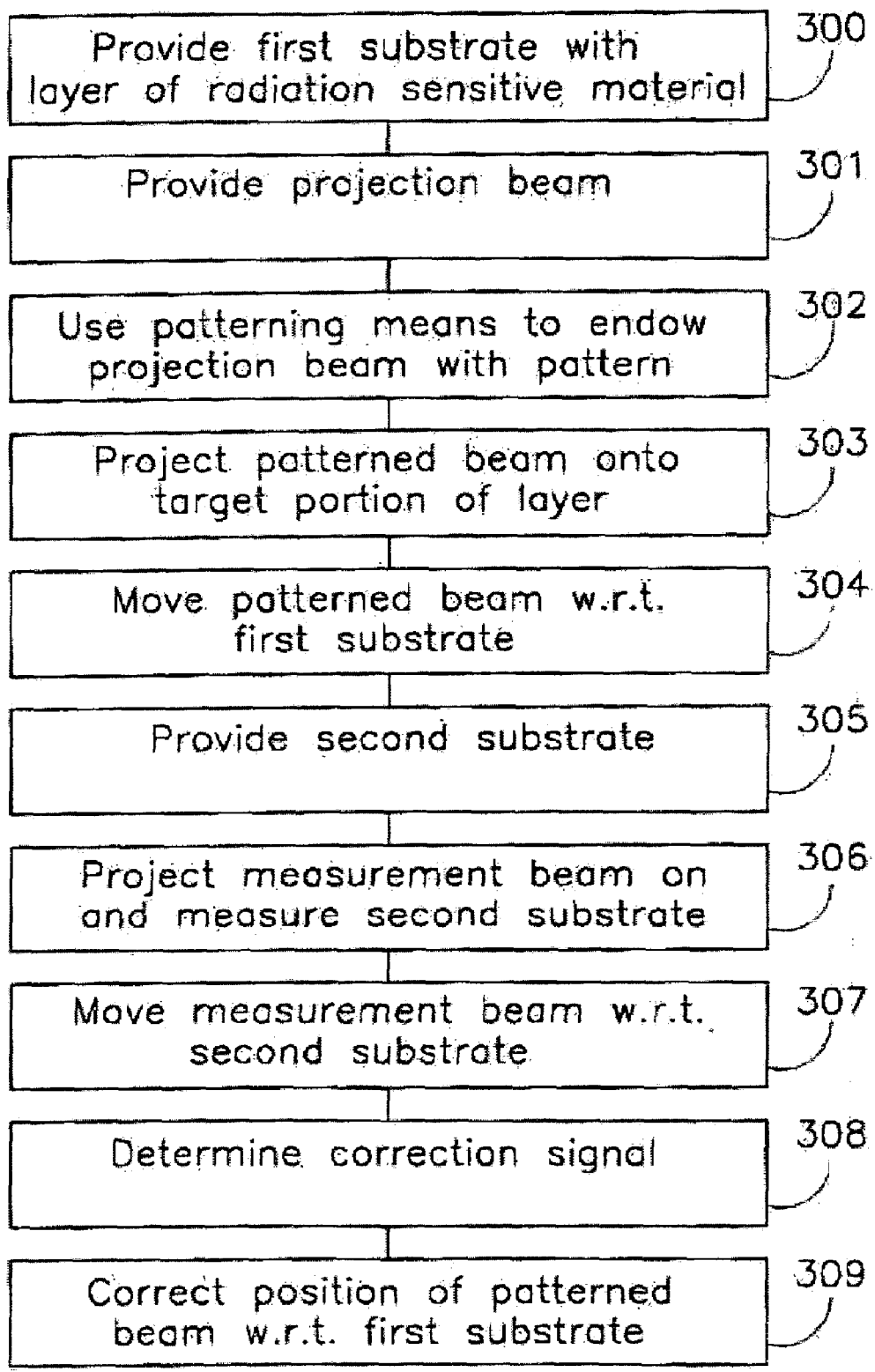
FIG. 4 shows a flow diagram of the method according to the invention.

FIG. 4 illustrates the device manufacturing method according to the invention. In task 300, a first substrate is provided. The first substrate is at least partly covered by a layer of radiation-sensitive material. In task 301 a beam of radiation is provided using a radiation system and, in task 302, the patterning device is used to endow the projection beam with a pattern in its cross-section. In task 303, the patterned beam is projected onto a target portion of the layer of radiation-sensitive material on the first substrate.

In task 304, the patterned beam is moved with respect to the first substrate. In task 305, a second substrate is provided while in task 306, a measurement beam is projected on a target portion of the second substrate and a surface property of the target portion of the second substrate is measured.

In task 307, the measurement beam is moved over a relevant portion of the surface of the second substrate. By moving the respective beams with respect to the respective substrates, the respective beam can move with respect to, such as scan, a relevant portion of the respective substrate. Thus, the patterned beam scans a relevant portion of the first substrate while the measurement beam scans a relevant portion of the second substrate. In step 308 a correction signal is determined for at least partly correcting an error of a position of the patterned beam on the first substrate, the error by a movement of a device for moving the measurement beam with respect to the second substrate. Of course, it is also possible that task 308 comprises the step of determining a correction signal for at least partly correcting an error of a position of the measurement beam on the second substrate, the error by a movement of a device for moving the patterned beam with respect to the first substrate.

In task 309, the position of the patterned beam with respect to the first substrate is corrected with the correction signal. It will be clear that it is also possible that in step 308 the position of the measurement beam with respect to the second substrate is corrected with the correction signal. Further, it will be clear to the skilled person that one or more steps or parts of the steps or all steps can be performed simultaneously, consecutively of in any suitable order.

Thus, in accordance with the present invention, a compensation scheme is provided that compensates for an error caused by a displacement of air due to a movement of a movable part of a lithographic system, in which the error is caused by displacement of air or pressure waves in the air due to a movement of another movable part of the lithographic apparatus. The compensation is calculated based on the acceleration of the movable part which causes the disturbance, and the distance (more preferably the inverse of the square distance) between the respective movable parts.

While specific embodiments of the invention have been described above, it will be appreciated that the invention may be practiced otherwise than as described. The description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
   (a) an exposure system comprising:
      a radiation system configured to condition a beam of radiation;
      a support structure configured to support a patterning device that imparts a desired pattern to the beam of radiation;
      a substrate holder configured TO hold a first substrate; and
      a projection system that projects the patterned beam onto a target portion of the first substrate, the projection system comprising a projection controller configured to control the projection onto the target position of the first substrate; and
      an exposure system controller configured to move a movable part of the exposure system such that the patterned beam is movable relative to the first substrate;
   (b) a measurement system comprising:
      an optical measurement device that projects a measurement beam to measure a surface property or a target portion of a second substrate;
      a second substrate bolder configured to hold the second substrate; and
      a measurement system controller configured to move a movable part of the measurement system such that the measurement beam is movable relative to the second substrate;
   (c) a correction determination mechanism configured to generate a correction signal that at least partly corrects an error of a position of the exposure system movable part caused by a movement of the measurement system movable part or at least partly corrects an error of p position of the measurement system movable part caused by a movement of the exposure system movable part; and
   (d) a signal feeder configured to supply the correction signal into the exposure system controller and/or measurement system controller for at least partly correcting the position of the respective exposure system controller and/or measurement system controller.

2. The apparatus of claim 1, wherein the correction determination mechanism is configured to determine the correction signal from the exposure system movable part and/or the measurement system movable part.

3. The apparatus of claim 1, wherein the correction determination mechanism is configured to calculate the correction signal based on information from the exposure system movable part and/or the measurement system movable part and on a distance between the exposure system movable part and the measurement system movable part.

4. The apparatus of claim 3, wherein:
   the information comprises an acceleration of the exposure system movable part and/or the measurement system movable part, the acceleration being provided by an acceleration detector employed by exposure system controller and/or measurement system controller, and
   the distance between the exposure system movable part and the measurement system movable part is calculated from respective positions of the exposure system movable part and/or the measurement system movable part, the respective positions being provided by respective position detectors employed by the exposure system and the measurement system.

5. The apparatus of claim 3, wherein the correction determination mechanism is further configured to:

determine an x-correction signal in order to correct an error in the position of the exposure system movable part or the measurement system movable part along an x-axis from an x-axis component of the information, and determine a y-correction signal in order to correct an error in the position of the movable part of the exposure system movable part or the measurement system movable part along a y-axis from an y-axis component of the information, wherein an x axis and a y axis is defined in a plane in which the exposure system movable part or the measurement system movable part are movable.

6. The apparatus of claim 5, wherein the exposure system controller and the measurement system controller are configured to generate the correction signal based on the formula:

$$F_{x,y} = \frac{C * Acc_{x,y}}{D_{xy}^2}$$

wherein $F_{x,y}$ is the correction signal in x and y direction respectively, C is a constant, $Acc_{x,y}$ is the acceleration in x and y direction respectively, and $D_{x,y}$ is the distance between the movable parts of the exposure system and the measurement system.

7. The apparatus of claim 5, wherein the correction determination mechanism is further configured to:

determine an x-to-y correction signal in order to correct an error in the position of the exposure system movable part or the measurement system movable part along the x-axis from an y-axis component of the information, and determine a y-to-x correction signal in order to correct an error in the position of the exposure system movable part or the measurement system movable part along the y-axis from an x-axis component of the information.

8. The apparatus of claim 7, wherein the exposure system controller and the measurement system controller are configured to generate the x-to-y correction signal or the y-to-x-correction signal based on the formula:

$$F_{x \text{ to } y, y \text{ to } x} = \frac{C * D_x * Acc_{x,y}}{D_y^2}$$

wherein $F_{x \text{ to } y, y \text{ to } x}$ is the x to y and the y to x correction signal respectively, C is a constant, $Acc_{x,y}$ is the acceleration in x and y direction respectively, $D_x$ is the distance between the movable parts of the exposure system and the measurement system in x direction, and $D_y$ is the distance between the movable parts of the exposure system and the measurement system in y direction.

9. The apparatus of claim 8, wherein the signal feeder comprises a delay for delaying at least one of the x-correction signal, the y-correction signal, the x-to-y correction signal, and the y-to-x correction signal.

10. The apparatus of claim 8, wherein the signal feeder is configured to add at least one of the x-correction signal, the y-correction signal, the x-to-y correction signal, and the y-to-x correction signal to a control signal at an output of a regulator in a closed loop feedback control loop.

11. A device manufacturing method, comprising:
providing a first substrate that is at least partially covered by a layer of radiation-sensitive material;
conditioning a beam of radiation;
configuring the conditioned beam of radiation with a desired pattern in its cross-section;
projecting the patterned beam of radiation onto a target portion of the first substrate;
moving the patterned beam relative to the first substrate;
providing a second substrate;
projecting a measurement beam onto a target portion of the second substrate to measure a surface property;
moving the measurement beam relative to the second substrate;
determining a correction signal for at least partly correcting an en-or of a position of the patterned beam or the measurement beam relative to the respective first substrate or second substrate,
wherein, for correcting the position error of the patterned beam, the error is caused by a movement of a device that moves the measurement beam relative to the second substrates, and
wherein, for correcting the position error of the measurement beam, the error is caused by a movement of a device that moves the patterned beam relative to the first substrate; and
correcting the position of the patterned beam or the measurement beam relative to the respective first or second substrate based on the correction signal.

* * * * *